United States Patent
Arai et al.

(10) Patent No.: US 10,067,420 B2
(45) Date of Patent: Sep. 4, 2018

(54) IMPRINT APPARATUS AND METHOD OF MANUFACTURING ARTICLE

(71) Applicant: CANON KABUSHIKI KAISHA, Tokyo (JP)

(72) Inventors: Tsuyoshi Arai, Utsunomiya (JP); Yutaka Mita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 700 days.

(21) Appl. No.: 14/560,058

(22) Filed: Dec. 4, 2014

(65) Prior Publication Data

US 2015/0158243 A1    Jun. 11, 2015

(30) Foreign Application Priority Data

Dec. 10, 2013    (JP) ................. 2013-255372

(51) Int. Cl.
  *G03F 7/00*    (2006.01)
  *B29K 101/00*    (2006.01)

(52) U.S. Cl.
  CPC ........ *G03F 7/0002* (2013.01); *B29K 2101/00* (2013.01)

(58) Field of Classification Search
  CPC .................................................. G03F 7/0002
  See application file for complete search history.

(56) References Cited

U.S. PATENT DOCUMENTS 7,824,504 B2    11/2010    Wada
8,828,307 B2    9/2014    Okushima et al.
2009/0098688 A1    4/2009    Okushima et al.
2009/0295006 A1    12/2009    Kawakami
2011/0316193 A1    12/2011    Kawakami
2012/0080820 A1    4/2012    Narioka et al.

FOREIGN PATENT DOCUMENTS

| CN | 101632040 A | 1/2010 |
|---|---|---|
| JP | 2002353096 A | 12/2002 |
| JP | 2007088262 A | 4/2007 |
| JP | 2009-286085 A | 12/2009 |
| JP | 2010052288 A | 3/2010 |
| JP | 5137635 B2 | 2/2013 |

(Continued)

OTHER PUBLICATIONS

Office Action issued in JP2013-255372, dated Aug. 24, 2015.

(Continued)

*Primary Examiner* — Ryan M Ochylski

(74) *Attorney, Agent, or Firm* — Rossi, Kimms & McDowell LLP

(57) ABSTRACT

The present invention provides an imprint apparatus which forms a pattern on a substrate, the apparatus including a supply unit including a discharge outlet which discharges the imprint material and configured to supply the imprint material onto the substrate via the discharge outlet, and a generation unit configured to generate ions by irradiating, with soft X-rays, a second space away from a first space between the mold and the substrate, wherein the discharge outlet and the generation unit are arranged to sandwich a side face of the mold, and a charge is removed in the first space by supplying the ions generated in the second space to the first space.

14 Claims, 5 Drawing Sheets

(56) References Cited

FOREIGN PATENT DOCUMENTS

| | | | |
|---|---|---|---|
| JP | 2013065813 A | | 4/2013 |
| JP | 2014154622 A | | 8/2014 |
| JP | 2014154623 A | * | 8/2014 |
| JP | 2014154623 A | | 8/2014 |
| JP | 2014154624 A | | 8/2014 |
| KR | 1020090130294 A | | 12/2009 |
| TW | 201035153 A | | 10/2010 |
| WO | 2010067691 A1 | | 6/2010 |

OTHER PUBLICATIONS

Taiwanese Office Action issued in Taiwanese counterpart application No. TW103139917, dated Oct. 16, 2015. English translation provided.
Office Action issued in Korean Patent Application No. 10-2014-0170606, dated Nov. 11, 2016.
Office Action issued in Chinese Application No. 201410749326.4 dated Apr. 28, 2018. English translation provided.

* cited by examiner

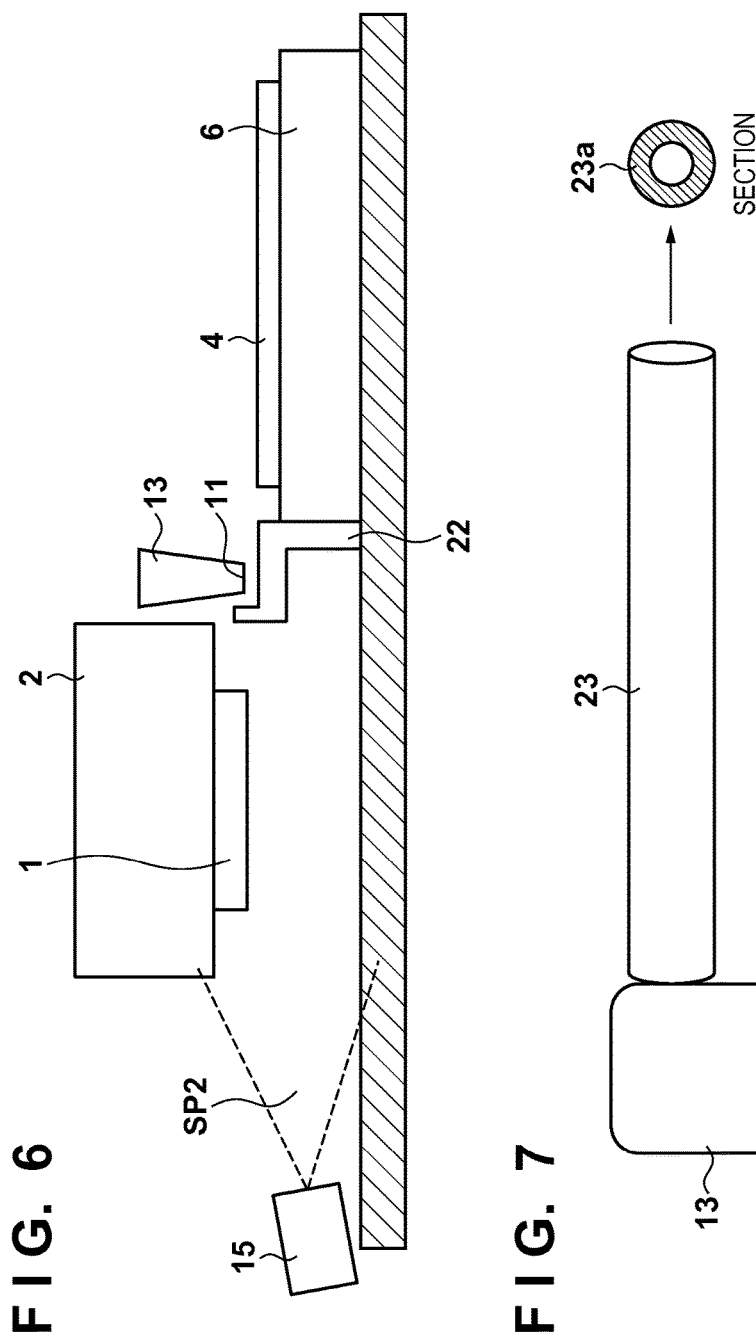

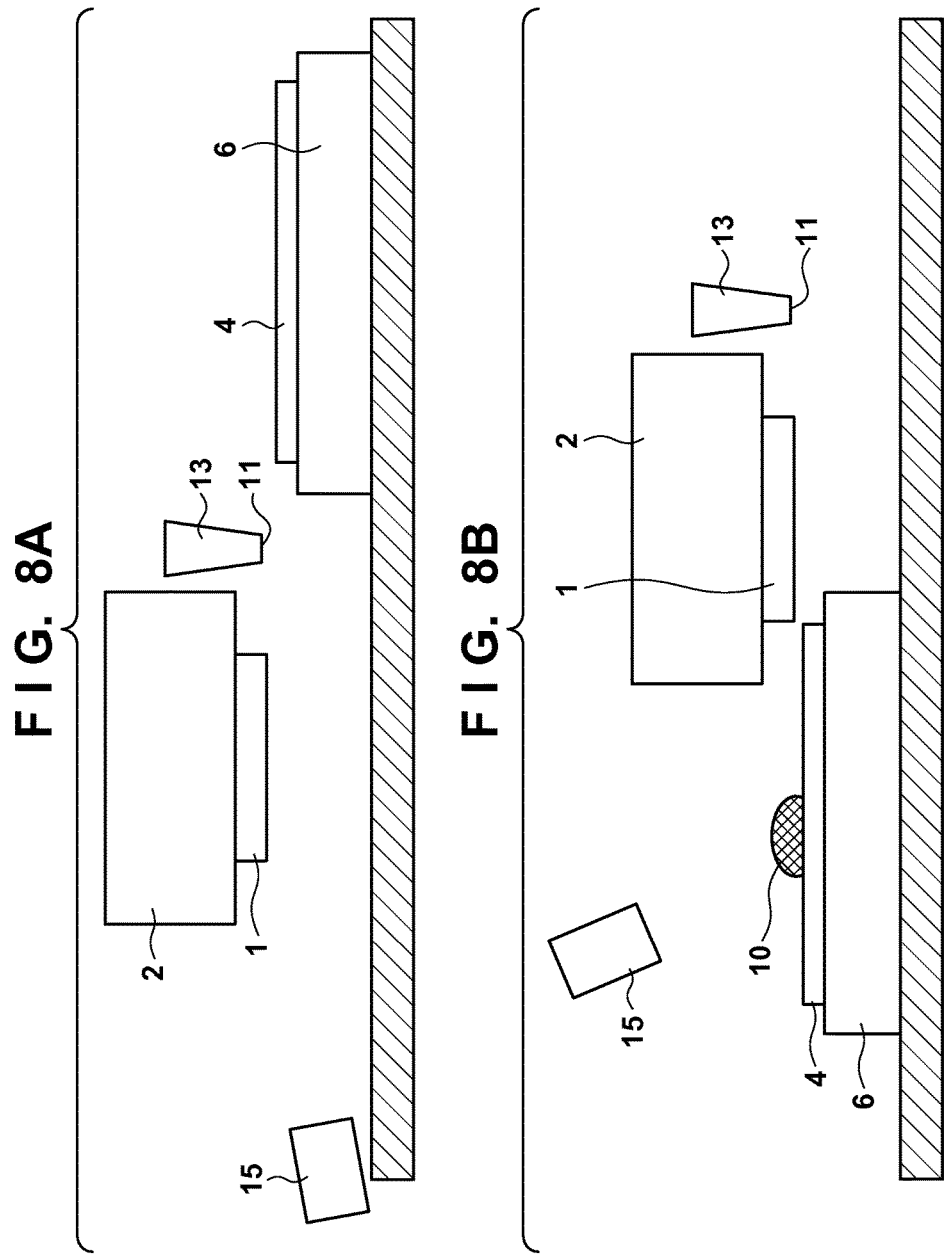

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

The imprint technique can form a nanoscale fine pattern, and is coming into practical use as one of lithography techniques for volume production of magnetic storage media and semiconductor devices. An imprint apparatus which employs the imprint technique forms a pattern on a substrate such as a silicon wafer or a glass plate using a mold (die), as an original, on which a fine pattern (unevenness) has been formed. The imprint apparatus, for example, coats the substrate with a light curable resin (for example, an ultraviolet-curing resin), and molds the resin using the mold. The resin is irradiated with light (for example, ultraviolet light) to be cured, and then the mold is separated from the cured resin, thereby forming the pattern of the resin on the substrate.

In a separating step of separating the mold from the cured resin on the substrate in the imprint apparatus, charge (separating charge) may occur on the respective surfaces of the mold and the patterns (transfer patterns) of the resin on the substrate. The separating charge may cause the discharge breakdown of the transfer pattern and the attraction of dust (particles) to the mold, thus causing a transfer pattern defect.

In order to reduce separating charge, Japanese Patent No. 5137635 and Japanese Patent Laid-Open No. 2009-286085 propose an imprint apparatus including an antistatic apparatus (ionizer). The imprint apparatus uses the ionizer which performs irradiation with soft X-rays free from dust.

In a conventional technique, however, the soft X-rays from the ionizer irradiate an uncured resin which exists within the imprint apparatus to start the polymerization reaction (curing reaction) of the resin. When a coating apparatus which coats (supplies) the substrate with the resin is arranged within the imprint apparatus, in particular, a resin which exists in the discharge outlet of the resin is cured upon irradiation of the discharge outlet with the soft X-rays, and the coating the substrate with the resin becomes unstable.

SUMMARY OF THE INVENTION

The present invention provides a technique advantageous in removing charge in a space between a mold and a substrate.

According to one aspect of the present invention, there is provided an imprint apparatus which performs irradiation with light to cure an imprint material in a state in which the imprint material on a substrate is kept in contact with a mold, and separates the mold from the cured imprint material, thereby forming a pattern on the substrate, the apparatus including a supply unit including a discharge outlet which discharges the imprint material and configured to supply the imprint material onto the substrate via the discharge outlet, and a generation unit configured to generate ions by irradiating, with soft X-rays, a second space away from a first space between the mold and the substrate, wherein the discharge outlet and the generation unit are arranged to sandwich a side face of the mold, and a charge is removed in the first space by supplying the ions generated in the second space to the first space.

Further aspects of the present invention will become apparent from the following description of exemplary embodiments with reference to the attached drawings.

BRIEF DESCRIPTION OF THE DRAWINGS

FIG. 6 is a schematic view showing the vicinities of the mold chuck, the substrate stage, the antistatic mechanism, and the discharge head.

FIG. 7 is a schematic view showing the arrangement of the supply pipe of the resin supply unit.

FIGS. 8A and 8B are schematic views showing the vicinities of the mold chuck, the substrate stage, the antistatic mechanism, and the discharge head.

DESCRIPTION OF THE EMBODIMENTS

Figure 1:
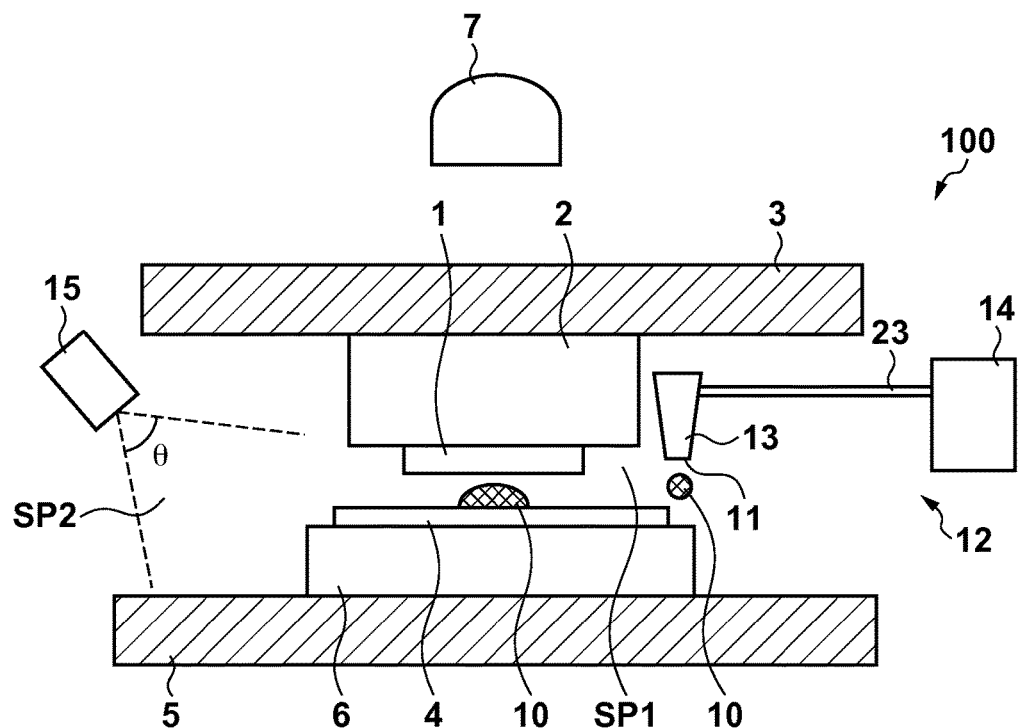
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 according to an aspect of the present invention. The imprint apparatus 100 is, for example, a lithography apparatus used for manufacturing a device such as a semiconductor device, and molds an imprint material (uncured resin) on a substrate using a mold (die) and forms a pattern on the substrate. In this embodiment, the imprint apparatus 100 performs irradiation with ultraviolet light to cure the imprint material in a state in which the imprint material on the substrate is kept in contact with the mold, and separates the mold from the cured imprint material on the substrate, thereby forming a pattern on the substrate.

The imprint apparatus 100 includes a mold chuck 2, a structure 3, a stage platen 5, a substrate stage 6, an irradiation unit 7, a resin supply unit 12, and an antistatic mechanism (ionizer) 15.

The mold chuck 2 is a mold holding member which holds a mold 1 on which unevenness (fine pattern) corresponding to a pattern that should be transferred onto a substrate 4 is formed, and is movable in a vertical direction (a direction that moves closer to or away from the substrate 4). The mold chuck 2 is supported by the structure 3.

The substrate 4 is held on the substrate stage 6 movable within the surface of the stage platen 5. A mechanism movable in a vertical direction (a direction that moves closer to or away from the mold 1) may be provided on the substrate stage 6. The substrate 4 is a substrate onto which the pattern of the mold 1 is transferred, and includes a silicon wafer and a glass plate.

The irradiation unit 7 includes a light source and an optical element, and performs irradiation with light for curing the imprint material. In this embodiment, an ultraviolet-curing resin 10 which is cured upon ultraviolet-light irradiation is used as the imprint material, and thus the irradiation unit 7 performs ultraviolet irradiation. Note that light (wavelength thereof) from the irradiation unit 7 to irradiate the imprint material is determined in accordance with a type of the imprint material.

The resin supply unit 12 supplies (coats) the substrate 4 with the resin 10. The resin supply unit 12 includes a discharge head 13 in which a discharge outlet 11 is formed to discharge the resin 10, a tank 14 which contains the resin 10, and a supply pipe 23 which connects the discharge outlet 11 and the tank 14 and supplies the resin 10 contained in the tank 14 to the discharge outlet 11. The discharge head 13 includes an inkjet mechanism which vibrates a piezoelectric element. The inkjet mechanism discharges the resin 10 from the discharge outlet 11 onto the substrate 4.

An imprint process, that is, a process of forming a pattern in a predetermined position (shot region) of the substrate 4 in the imprint apparatus 100 will be described. In the imprint process, first, the substrate stage 6 is moved to position the substrate 4 under the discharge outlet 11 of the discharge head 13 of the resin supply unit 12, and the resin 10 is supplied (coated) onto the substrate 4 via the discharge outlet 11.

Next, the substrate stage 6 is moved to position the substrate 4 on which the resin 10 has been coated under the mold 1, and the mold chuck 2 is moved in the direction to come closer to the substrate 4, thereby bringing the resin 10 on the substrate 4 into contact with the mold 1 (pressing the mold 1 against the substrate 4). At this time, the resin 10 on the substrate 4 may be brought into contact with the mold 1 by moving the substrate stage 6 in the direction to come closer to the mold 1. The mold 1 contacts the resin 10 which is in a state of fluidity, that is, the uncured resin 10, thereby filling the pattern (recessed portion) of the mold 1 with the resin 10 on the substrate 4.

Then, in a state in which the resin 10 on the substrate 4 and the mold 1 are in contact with each other, the resin 10 is irradiated with ultraviolet light from the irradiation unit 7 via the mold 1. The polymerization reaction of the resin 10 starts upon the ultraviolet-light irradiation, and the resin 10 molded on the mold 1 is cured.

Then, the mold chuck 2 is moved in the direction away from the substrate 4, thereby separating the mold 1 from the cured resin 10 on the substrate 4. Accordingly, the pattern (transfer pattern) of the resin 10 is formed in the predetermined shot region of the substrate 4.

By repeating these steps, the patterns of the resin 10 can be formed on the entire surface of the substrate 4, that is, all the shot regions of the substrate 4.

In the imprint process in the imprint apparatus 100, in a separating step of separating the mold 1 from the cured resin 10 on the substrate 4, charge (separating charge) occurs on the surfaces of the mold 1 and the transfer pattern. If the surfaces of the mold 1 and the transfer pattern become charged, the discharge breakdown of the transfer pattern and the attraction of dust (particles floating in a surrounding space) to the mold 1 occur, thereby generating a transfer pattern defect.

The imprint apparatus 100 includes the antistatic mechanism 15 to remove the separating charge generated in such a separating step. In this embodiment, the antistatic mechanism 15 functions as a generation unit which generates ions by irradiating, with soft X-rays, a second space SP2 away from a first space (imprint space) SP1 between the mold 1 and the substrate 4.

The antistatic mechanism 15 can apply any arrangement known in the art, and performs irradiation with soft X-rays generated by, for example, a fluorescent lamp from an irradiation window to the second space SP2. The soft X-ray irradiation from the antistatic mechanism 15 generates high-density ions by ionization. The irradiation angle $\theta$ of the soft X-ray irradiation from the antistatic mechanism 15 is large, and thus static electricity can be removed in a wide range. Air containing many ions generated by the soft X-ray irradiation from the antistatic mechanism 15 reaches in the vicinity of the mold 1 along the channel of a gas flowing around the first space SP1 (riding an air current), and removes the charge of the mold 1 and the charge of the transfer pattern on the substrate 4. As described above, the imprint apparatus 100 supplies the ions generated in the second space SP2 to the first space SP1, thereby removing the charge in the first space SP1. Removing the charge in the first space SP1 includes removing the separating charge generated in the separating step, or more specifically, includes at least one of removal of the charge for the mold 1 and removal of the charge for the transfer pattern on the substrate 4.

On the other hand, the resin 10 supplied onto the substrate 4 is also cured by irradiation with soft X-rays. As shown in FIG. 1, the discharge outlet 11 of the discharge head 13 of the resin supply unit 12 exists inside the imprint apparatus 100. The discharge outlet 11 is in a state in which the resin 10 and a surrounding gas forms a boundary (interface). Therefore, if the interface is irradiated with soft X-rays, the resin 10 existing at the interface is cured to cause the clogging of the discharge outlet 11, and the supply of the resin 10 onto the substrate 4 becomes unstable (the discharge failure of the resin 10 occurs).

To cope with this, in this embodiment, the discharge outlet 11 of the discharge head 13 of the resin supply unit 12 and the antistatic mechanism 15 are arranged to sandwich the side face of the mold 1. In addition, the discharge outlet 11 of the discharge head 13 of the resin supply unit 12 is arranged outside the irradiation angle $\theta$ of the soft X-ray irradiation from the antistatic mechanism 15. In this embodiment, the discharge outlet 11 of the discharge head 13 is arranged in a downward direction toward the substrate 4 so that the discharge outlet 11 does not exist inside the irradiation angle $\theta$ of the soft X-ray irradiation from the antistatic mechanism 15. Hence, only if the discharge outlet 11 of the discharge head 13 of the resin supply unit 12 and the antistatic mechanism 15 are arranged as described above, the discharge outlet 11 is not directly irradiated with the soft X-rays from the antistatic mechanism 15.

Figure 2:
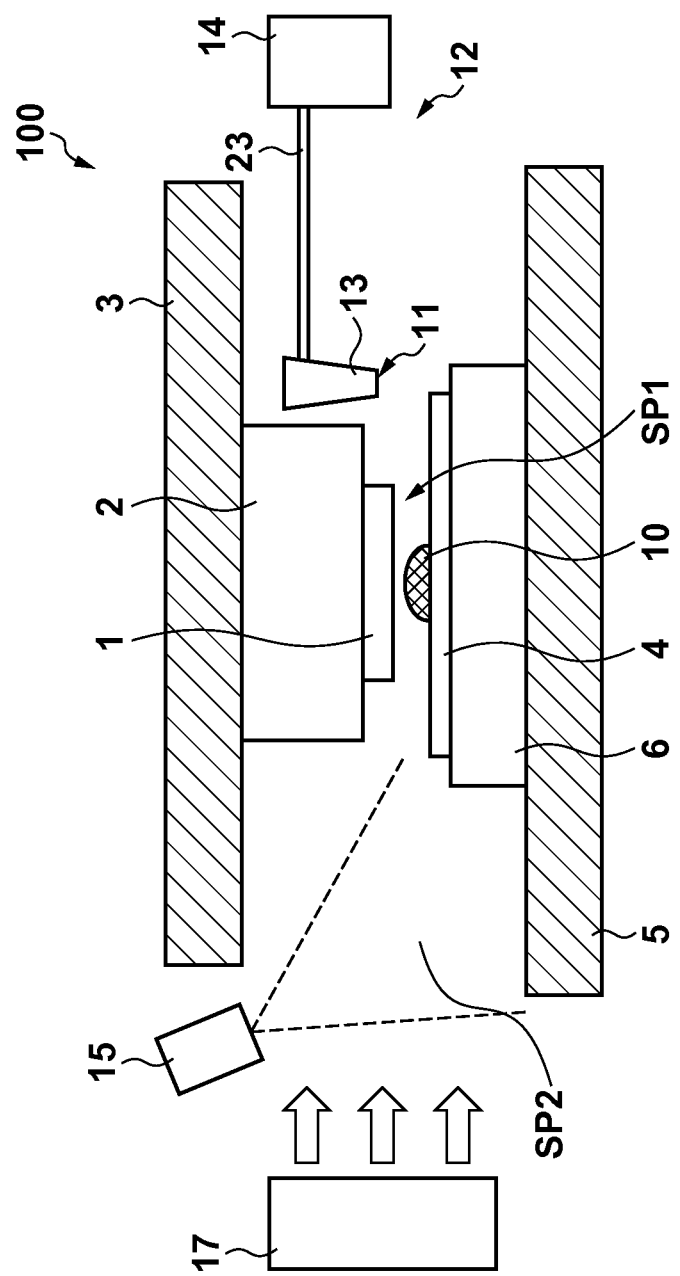
FIG. 2 is a schematic view showing the arrangement of the imprint apparatus according to an aspect of the present invention.

The imprint apparatus 100 also includes, as shown in FIG. 2, a gas supply unit 17 which supplies a gas to the imprint apparatus 100 in order to increase cleanliness of an internal space including the first space SP1 and the second space SP2. The gas supply unit 17 includes, for example, a blower, and supplies a clean gas through a filter to the first space SP1 and forms a channel from the second space SP2 to the first space SP1. While the antistatic mechanism 15 is arranged on the upstream side of the channel from the second space SP2 to the first space SP1, the discharge outlet 11 of the discharge head 13 of the resin supply unit 12 is arranged on the downstream side of the channel from the second space SP2 to the first space SP1. Accordingly, the mold 1 and the discharge outlet 11 (first space SP1) are not directly irradiated with the soft X-rays from the antistatic mechanism 15, but the second space SP2 between the gas supply unit 17 and the first space SP1 is irradiated with the soft X-rays from the antistatic mechanism 15, thereby supplying the ions generated in the second space SP2 to the first space SP1 via the channel. The charge is removed in the first space SP1 by the ions thus supplied to the first space SP1. This makes it possible, in the imprint apparatus 100, to eliminate the separating charge generated in the separating step and prevent the resin 10 existing in the discharge outlet 11 of the discharge head 13 from being cured.

The imprint apparatus 100 can prevent the discharge breakdown of the transfer pattern on the substrate 4 and the attraction of dust to the mold 1, and also keep the discharge outlet 11 in a good state (a state without the discharge failure caused by the curing of the resin 10), thereby performing a good imprint process continuously.

In this embodiment, the discharge outlet 11 of the discharge head 13 of the resin supply unit 12 has been described as an example of a portion where the curing of the resin 10 by irradiation with the soft X-rays from the antistatic mechanism 15 poses a problem. However, the portion where the curing of the resin 10 poses the problem is not limited to the discharge outlet 11. The portion where the curing of the resin 10 poses the problem includes, for example, portions where the uncured resin 10 exists inside the imprint apparatus 100 such as the tank 14 and the supply pipe 23 of the resin supply unit 12, and the maintenance mechanism of the discharge outlet 11. Therefore, the antistatic mechanism 15 and the portions where the uncured resin 10 exists are arranged so as not to directly irradiate these portions with the soft X-rays from the antistatic mechanism 15.

As for the uncured resin 10 on the substrate 4, the conveyance path of the substrate 4 from a position where the resin 10 is supplied onto the substrate 4 to a position where the imprint process is performed is arranged outside the irradiation angle θ of the soft X-ray irradiation from the antistatic mechanism 15. This is also applicable to a case where the resin supply unit 12 is arranged outside the imprint apparatus 100, that is, a case where the substrate 4 which has received the resin 10 outside the imprint apparatus 100 is loaded.

Figure 3:
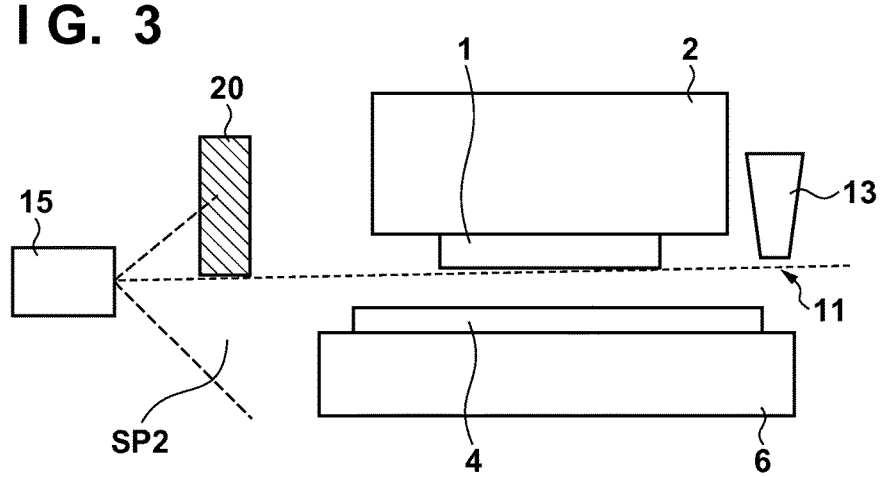
FIG. 3 is a schematic view showing the vicinities of a mold chuck, a substrate stage, an antistatic mechanism, and a discharge head.

Also, as shown in FIG. 3, a shield member 20 may be arranged between the antistatic mechanism 15 and the discharge outlet 11 of the discharge head 13 of the resin supply unit 12 to restrict the irradiation angle of the soft X-rays with which the antistatic mechanism 15 irradiates the second space SP2. The shield member 20 preferably restricts the irradiation angle in the vicinity of the antistatic mechanism 15. For example, in FIG. 3, the shield member 20 shields, out of soft X-rays which spread out in a conical shape from the antistatic mechanism 15 (the exit port of the soft X-rays), the soft X-ray which passes above a straight line connecting the antistatic mechanism 15 and the discharge outlet 11, that is, the soft X-ray which is headed for the discharge outlet 11. This makes it possible to more efficiently prevent the discharge outlet 11 from being directly irradiated with the soft X-rays from the antistatic mechanism 15.

Figure 4:
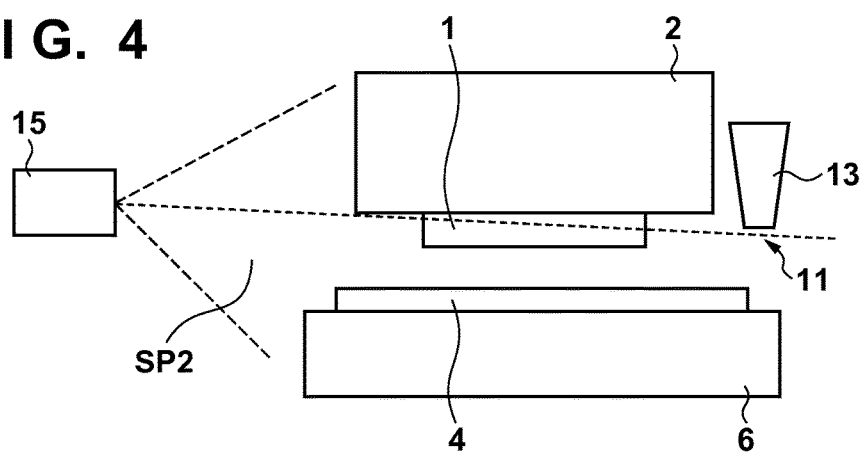
FIG. 4 is a schematic view showing the vicinities of the mold chuck, the substrate stage, the antistatic mechanism, and the discharge head.

Furthermore, as shown in FIG. 4, the soft X-ray irradiation from the antistatic mechanism 15 may be shielded not by arranging the shield member 20 but by using a structure which forms the imprint apparatus 100. In FIG. 4, the mold chuck 2 is arranged between the antistatic mechanism 15 and the discharge outlet 11 to shield, by the mold chuck 2, the soft X-ray irradiation from the antistatic mechanism 15 to the discharge outlet 11 of the discharge head 13 of the resin supply unit 12. This makes it possible to more efficiently prevent the discharge outlet 11 from being directly irradiated with the soft X-rays from the antistatic mechanism 15.

Figure 5A:
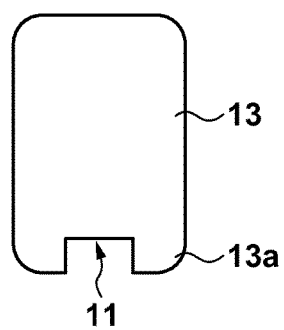
FIGS. 5A and 5B are schematic views showing the vicinity of the discharge outlet of the discharge head of a resin supply unit.

Also, as shown in FIG. 5A, the vicinity of the discharge outlet 11 of the discharge head 13 of the resin supply unit 12 may serve as a shield structure which shields the soft X-ray irradiation from the antistatic mechanism 15. In FIG. 5A, the discharge head 13 has a member 13a which protrudes on the side of the substrate from a surface where the discharge outlet 11 is formed and surrounds the discharge outlet 11. The member 13a shields the soft X-ray irradiation from the antistatic mechanism 15 to the discharge outlet 11 of the discharge head 13 of the resin supply unit 12. This makes it possible to more efficiently prevent the discharge outlet 11 from being directly irradiated with the soft X-rays from the antistatic mechanism 15.

Figure 5B:
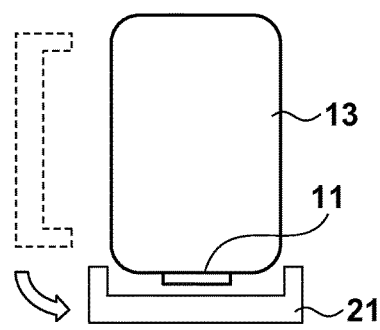

The shield member which shields the soft X-ray irradiation from the antistatic mechanism 15 to the discharge outlet 11 of the discharge head 13 of the resin supply unit 12 need not always be in a fixed position. Consider a case in which, for example, the substrate stage 6 shields the soft X-rays from the antistatic mechanism 15 to the discharge outlet 11. In this case, while the imprint process is in progress, for example, while the substrate stage 6 is positioned under the discharge outlet 11 of the discharge head 13 of the resin supply unit 12, the substrate stage 6 can shield the soft X-rays from the antistatic mechanism 15 to the discharge outlet 11. Note that if the substrate stage 6 moves away from under the discharge outlet 11 when exchanging the substrate 4 or the like, the discharge outlet 11 may be irradiated with the soft X-rays from the antistatic mechanism 15 to the discharge outlet 11. In such a case, while the substrate stage 6 is not positioned under the discharge outlet 11 of the discharge head 13 of the resin supply unit 12, the shield member which shields the soft X-rays from the antistatic mechanism 15 to the discharge outlet 11 is inserted between the antistatic mechanism 15 and the discharge outlet 11. More specifically, as shown in FIG. 5B, a lid 21 detachable from the discharge head 13 is provided in the resin supply unit 12 to cover the discharge outlet 11 of the discharge head 13.

A case in which the substrate stage 6 moves farther away from a normal imprint position (a position under the mold 1) is also considered. In such a case, as shown in FIG. 6, a cover member 22 which covers the discharge outlet 11 of the discharge head 13 is arranged on the substrate stage 6. In a state in which the substrate stage 6 is positioned farther away from the imprint position, the cover member 22 covers the discharge outlet 11.

From the viewpoint of preventing the uncured resin 10 from being irradiated with the soft X-rays from the antistatic mechanism 15, for example, as shown in FIG. 7, the supply pipe 23 which supplies the resin 10 to the discharge outlet 11 is made of a shield member 23a which shields the soft X-ray irradiation from the antistatic mechanism 15. For example, a resin tube having a thickness of 1 mm or more or a metal tube having a thickness of about 0.1 mm or more is used as the shield member 23a. Note that all systems for supplying the uncured resin 10 such as the tank 14, the joint of the supply pipe 23, and a manifold may be made of shield members which shield the soft X-ray irradiation from the antistatic mechanism 15.

It is also possible, in the imprint apparatus 100, to temporarily stop irradiation with the soft X-rays by the antistatic mechanism 15. Therefore, if the discharge outlet 11 may be irradiated with the soft X-rays from the antistatic mechanism 15 to the discharge outlet 11, the irradiation with the soft X-rays by the antistatic mechanism 15 is stopped. Consider a case in which, for example, the substrate stage 6 shields the soft X-rays from the antistatic mechanism 15 to the discharge outlet 11. In this case, as shown in FIG. 8A, when the substrate stage 6 moves farther away from the normal imprint position, the antistatic mechanism 15 stops the irradiation with the soft X-rays. Furthermore, as shown in FIG. 8B, when the substrate stage 6 on which the substrate 4 is held moves and the uncured resin 10 exists inside the irradiation angle of the soft X-ray irradiation from the antistatic mechanism 15, the antistatic mechanism 15 stops the irradiation with the soft X-rays.

As described above, the imprint apparatus 100 can prevent the discharge breakdown of the transfer pattern on the substrate 4 and the attraction of dust to the mold 1, and also keep the discharge outlet 11 in the good state, thereby performing the good imprint process continuously. Hence, the imprint apparatus 100 can provide an article such as a high-quality semiconductor device economically with high throughput.

A method of manufacturing a device (the semiconductor device, a magnetic storage media, a liquid crystal display element, or the like) serving as the article will be described. The manufacturing method includes a step of forming the pattern on the substrate (a wafer, a glass plate, a film-like substrate, or the like) using the imprint apparatus 100. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-255372 filed on Dec. 10, 2013, which is hereby incorporated by reference herein in its entirety.

What is claimed is:

1. An imprint apparatus which cures an imprint material in a state in which the imprint material on a substrate is kept in contact with a mold, and separates the mold from the cured imprint material, thereby forming a pattern on the substrate, the apparatus comprising:
a supply unit configured to supply the imprint material onto the substrate from a discharge outlet which discharges the imprint material; and
a generation unit configured to emit soft X-rays and generate ions, by the emitted soft X-rays, to be supplied to a space including an imprint position,
wherein the discharge outlet is arranged in a position where the soft X-rays emitted from the generation unit to the discharge outlet are shielded by a holding member configured to hold the mold, and
wherein the generation unit generates ions in a space in a lateral direction of the mold by emitting soft X-rays to the space in the lateral direction of the mold without passing through the mold.

2. The apparatus according to claim 1, further comprising a gas supply unit arranged in the same side as the generation unit to the holding member,
wherein the gas supply unit is configured to supply a gas so that the ions generated by irradiating the soft X-rays are supplied to the space including the imprint position.

3. The apparatus according to claim 1, wherein an exit port of the soft X-rays of the generation unit is directed obliquely downward.

4. The apparatus according to claim 1, further comprising a shield member configured to shield soft X-rays emitted from the generation unit to the discharge outlet.

5. The apparatus according to claim 1, further comprising a movable stage configured to hold the substrate,
wherein the stage includes a lid member which is able to cover the discharge outlet in a state in which the stage is positioned away from the imprint position in a horizontal direction.

6. The apparatus according to claim 1, wherein the supply unit includes a supply pipe which is connected to the discharge outlet and is configured to supply the imprint material, and
the supply pipe is formed to shield the soft X-ray emitted from the generation unit.

7. The apparatus according to claim 6, wherein the supply pipe is made of one of a resin with a thickness of not less than 1 mm and a metal with a thickness of not less than 0.1 mm.

8. The apparatus according to claim 1, wherein at least one of removal of a charge for the mold and removal of a charge for the cured imprint material on the substrate is performed by the ions supplied to the space including the imprint position.

9. The apparatus according to claim 1, wherein the space including the imprint position is a space under the holding member which is configured to hold the mold.

10. An imprint apparatus which cures an imprint material in a state in which the imprint material on a substrate is kept in contact with a mold, and separates the mold from the cured imprint material, thereby forming a pattern on the substrate, the apparatus comprising:
a supply unit configured to supply the imprint material onto the substrate from a discharge outlet which discharges the imprint material;
a generation unit configured to generate ions, by irradiating soft X-rays, to be supplied to a space including an imprint position; and
a shield member configured to shield the soft X-rays emitted from the generation unit to the discharge outlet,
wherein a holding member configured to hold the mold is arranged between the generation unit and the supply unit, and
wherein the generation unit generates ions in a space in a lateral direction of the mold by emitting soft X-rays to the space in the lateral direction of the mold without passing through the mold.

11. The apparatus according to claim 10, wherein the supply unit includes a discharge head where the discharge outlet is formed, and
the shield member is a portion which protrudes on a side of the substrate from a surface where the discharge outlet of the discharge head is formed and surrounds the discharge outlet.

12. The apparatus according to claim 10, wherein the shield member is a lid member which is included in the supply unit and able to cover the discharge outlet.

13. An imprint apparatus which cures an imprint material in a state in which the imprint material on a substrate is kept in contact with a mold, separates the mold from the cured imprint material, thereby forming a pattern on the substrate, and supplies ions to a space between the mold separated from the cured imprint material and the substrate, the apparatus comprising:
- a holding member configured to hold the mold;
- a supply unit including a discharge outlet which discharges the imprint material; and
- a X-ray source configured to emit soft X-rays for generating the ions,
- wherein the discharge outlet is arranged in a position where the soft X-rays emitted from the X-ray source to the discharge outlet are shielded by the holding member, and
- wherein the X-ray source generates ions in a space in a lateral direction of the mold by emitting soft X-rays to the space in the lateral direction of the mold without passing through the mold.

14. An imprint apparatus which cures an imprint material in a state in which the imprint material on a substrate is kept in contact with a mold, separates the mold from the cured imprint material, thereby forming a pattern on the substrate, and supplies ions to a space between the mold separated from the cured imprint material and the substrate, the apparatus comprising:
- a holding member configured to hold the mold;
- a supply unit including a discharge outlet which discharges the imprint material;
- a X-ray source configured to emit soft X-rays for generating the ions; and
- a shield member configured to shield the soft X-rays emitted from the X-ray source to the discharge outlet,
- wherein the holding member is arranged between the X-ray source and the supply unit, and
- wherein the X-ray source generates ions in a space in a lateral direction of the mold by emitting soft X-rays to the space in the lateral direction of the mold without passing through the mold.

\* \* \* \* \*